United States Patent [19]

Okamoto

[11] Patent Number: 4,905,316
[45] Date of Patent: Feb. 27, 1990

[54] MAGNETIC FIELD GENERATING SYSTEM FOR MAGNETIC RESONANCE IMAGING SYSTEM

[75] Inventor: Kazuya Okamoto, Yokohama, Japan

[73] Assignee: Kabushiki Kaisha Toshiba, Kawasaki, Japan

[21] Appl. No.: 136,337

[22] Filed: Dec. 22, 1987

[30] Foreign Application Priority Data

Dec. 22, 1986 [JP] Japan ................................ 61-303671

[51] Int. Cl.⁴ .......................................... G01R 33/20
[52] U.S. Cl. ..................................... 324/319; 335/216
[58] Field of Search ............... 324/300, 318, 319, 320; 335/216, 299; 505/844; 242/7.03, 7.07

[56] References Cited

U.S. PATENT DOCUMENTS

| | | | |
|---|---|---|---|
| 4,590,428 | 5/1986 | Müller et al. | 324/320 |
| 4,652,824 | 3/1987 | Oppelt | 324/319 |
| 4,688,132 | 8/1987 | Dustmann | 335/216 |

FOREIGN PATENT DOCUMENTS

50-65187 2/1975 Japan .

*Primary Examiner*—Hezron E. Williams
*Assistant Examiner*—Kevin D. O'Shea
*Attorney, Agent, or Firm*—Oblon, Spivak, McClelland, Maier & Neustadt

[57] ABSTRACT

A magnetic field generating system for use in a magnetic resonance imaging system to apply a static magnetic field and additionally a gradient field and a high frequency field to a body under examination in order to excite a magnetic resonance and to collect magnetic resonance data about the magnetic resonance. The field generating system comprises a superconducting including magnet a superconducting coil for generating the static magnetic field, a gradient coil for generating the gradient field and a high frequency coil for generating the high frequency field. At least part of the superconducting magnet is made of a metal member, and at least part of the metal member is interposed between the superconducting coil the gradient coil provided with non-conductive sections for impeding an eddy current.

6 Claims, 5 Drawing Sheets

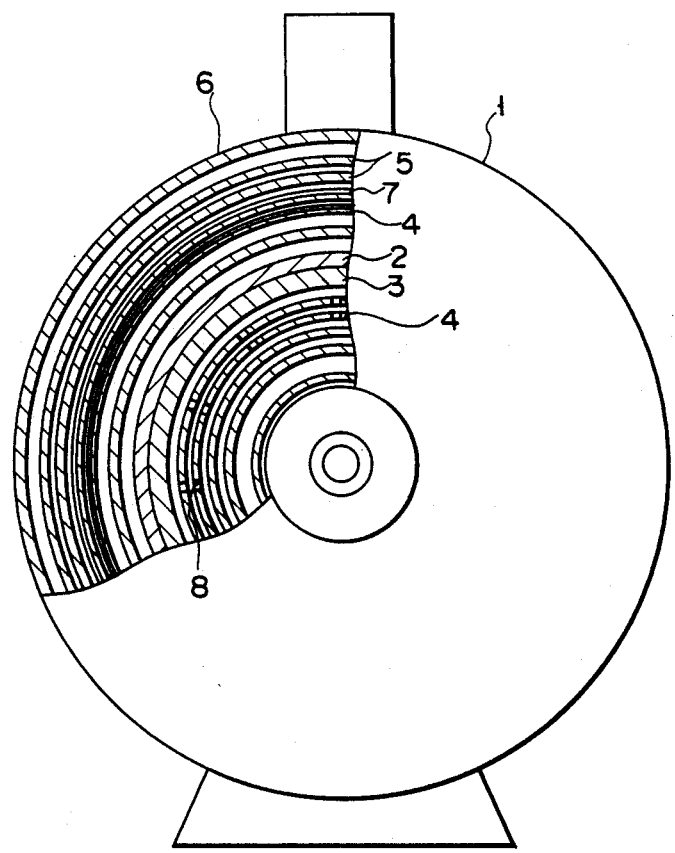
F I G. 2A

MAGNETIC FIELD GENERATING SYSTEM FOR MAGNETIC RESONANCE IMAGING SYSTEM

BACKGROUND OF THE INVENTION

The present invention relates to a magnetic resonance (MR) imaging system using a superconducting magnet as a source for generating a static magnetic field, and, in particularly, to a magnetic field generating system which reduces the influence of an eddy current at the time a gradient field is applied in a pulse shape.

In MR imaging systems, a magnetic resonance phenomenon occurs when a uniform static magnetic field as well as a pulsed gradient field and a pulsed high frequency field are applied to a living body under examination. Further, in the MR imaging systems, a magnetic resonance signal produced from within the body is detected on the basis of the magnetic resonance phenomenon and is subjected to a process including an image reconstruction. As a result of this process, the MR imaging systems provide image data representing a spatial distribution of nucleus spins of a particular atomic nuclide in the body under examination.

The MR imaging systems require that a static magnetic field with high intensity, uniformity and stableness be generated. In particularly, it is necessary to provide a high S/N (signal-to-noise ratio) and a high resolution in order to obtain more delicate and complex magnetic resonance data, which may be used for imaging a chemical shift or a number of nuclide or nuclear species. Then, a static magnetic field with high intensity, uniformity and stableness needs to be generated. A superconducting magnet is suitable as a source to generate a static magnetic field that satisfies the above conditions.

The basic structure of a superconducting magnet used as a static magnetic field generating source in MR imaging systems will now be explained. A superconducting coil made of a superconducting wire material is wound around a bobbin made of metal that is non-magnetic even at a low temperature, and the overall coil assembly is dipped in a liquid helium serving as a cooling medium. The outside of the liquid helium, up to the outermost layer that communicates with the ambient temperature, are covered by a plurality of heat shielding plates made of high thermal conductivity, with layers of liquid nitrogen sandwiched therebetween. Of the multi-layered structure, those layers which do not contain the liquid helium or the liquid nitrogen are made vacuous. Such a low temperature container is typically called a cryostat. The heat shielding plates are made of a metal with a high thermal conductivity and a non-magnetism at a low temperature, typically of aluminum.

In the MR imaging systems, gradient coils are provided inside the static magnetic field generating superconducting magnet. Consequently, the flux generated by the gradient pulse, or the gradient field generated in a pulse form, from the gradient coils interlinks with the metal member (e.g., the heat shielding plates) constituting the cryostat and as change in the interlinked flux generates an eddy current. The flux generated by the eddy current distorts the pulse shape of the gradient pulse.

This distortion process is illustrated in FIGS. 1A through 1D. FIG. 1A illustrates a current flowing across the gradient coil and FIG. 1B illustrates the waveform of a gradient pulse $H_1$. A change in flux caused at the rising or falling of the gradient pulse $H_1$ causes an eddy current to flow at the metal member of the superconducting magnet, and this eddy current causes a magnetic field $H_2$ as shown in FIG. 1C to be generated from the metal member as a consequence. As illustrated in FIG. 1C, the eddy-current-originated field $H_2$ is generated at the rising and falling edge portions of the gradient pulse $H_1$. The attenuation constant of the field $H_2$ caused by the eddy current is determined by the material and the shape of the metal member. As this field $H_2$ is superimposed on the original gradient pulse $H_1$, the resultant gradient pulse $H_1$ would have a waveform which becomes blunted at its rising and falling edge portions, as shown due to the pulse $H_1'$ of FIG. 1D. This deformation of the gradient pulse is one cause to deteriorate the image quality and should therefore be dealt with.

To suppress the magnetic field caused by the eddy current, a metal of low electric conductivity, such as stainless steel, may be used a the metal member for the heat shielding plates, etc. so as to make it difficult for the eddy current to flow therethrough, or the space between the gradient coil and the superconducting magnet (accommodated in the cryostat) used for generating the static magnetic field may be set large.

However, because of its low thermal conductivity, the stainless steel increases the loss by the liquid helium and liquid nitrogen so that the former method of using the stainless steel is not suitable. The latter method requires that the image pick-up space in which the body under examination comes should be made smaller to reduce the diameter of the gradient coil or the diameter of the superconducting magnet should be increased, thus enlarging the imaging apparatus. Accordingly, this latter method is not suitable, either.

As should be clear from the above, according to the conventional MR imaging systems using a superconducting magnet, it is difficult to remove the influence of the magnetic field caused by the eddy current flowing through the metal member of the superconducting magnet by the gradient pulse.

SUMMARY OF THE INVENTION

With the above in mind, therefore, it is an object of this invention to provide a magnetic field generating system for an MR imaging system, which can suppress an eddy current generated, by a gradient pulse, in a metal member of a superconducting magnet used for generating a static magnetic field so as to effectively reduce the influence of a magnetic field caused by the eddy current, and provide a high quality image with reduced artifact, even if the electric conductivity of the metal member of the superconducting magnet is high or the space between the superconducting magnet and a gradient coil disposed inside the magnet is small.

According to this invention, a non-conductive section to impede the eddy current is formed at at least part of the metal member that constitutes at least part of the superconducting magnet, whereby the eddy current flow can be suppressed.

If a non-conductive section such as a slit is formed at a metal member such as a heat shielding plate in the superconducting magnet, this non-conductive section serves as a resistor to the eddy current caused by the gradient pulse. This resistor hinders the flow of the eddy current in the metal member and reduces the attenuation time constant of the eddy current. As a result, the intensity of the magnetic field generated by the eddy current from the metal member is reduced and the field is rapidly attenuated. Therefore, the waveform deformation of the gradient pulse, which originates in the magnetic field and is caused by the eddy current, is reduced, and a magnetic resonance image, attained by the MR imaging system, is improved as a consequence.

In addition, with the reduction of the eddy current, it is possible to select a metal member which is non-magnetic at a low temperature and yet has a high thermal conductivity (generally, a high thermal conductive material has a high electric conductivity), so that the cooling loss by the cooling medium would be reduced by the amount equivalent to the increase in the thermal conductivity. What is more, the reduction in the eddy current can ensure that the space between the supeconducting magnet and the gradient coil is made smaller, contributing to the compactness of the imaging apparatus while maintaining a sufficient image pick-up space.

According to this invention, a non-conductive section to impede the eddy current, for example, a slit, is formed at at least part of the metal member that constitutes at least part of the superconducting magnet, so as to suppress the generation of the eddy current. Therefore, the influence of a magnetic field caused by the eddy current can effectively reduced and a high quality image with reduced artifact can be attained as a consequence.

What is more, with the use of this invention, even if the metal member on which a non-conductive section, such as a slit, is formed has a high electric conductivity, the eddy current can effectively be suppressed. Therefore, the cooling loss by a cooling medium such as liquid helium and/or liquid nitrogen can be reduced by using a material which is non-magnetic and yet has a high electric conductivity for the metal member.

Further, unlike the conventional MR imaging systems, the system according to the present invention does not require that the space between the superconducting magnet and the gradient coil be set large in order to reduce the influence of the eddy current. Accordingly, the imaging system can be made compact while maintaining a sufficiently large image pick-up space.

BRIEF DESCRIPTION OF THE DRAWINGS

FIGS. 2A and 2B are respectively, partly-cutaway, front and side views of a field generating system for use in an MR imaging system according to one embodiment of this invention;

DETAILED DESCRIPTION OF THE PREFERRED EMBODIMENTS

Figure 1A:
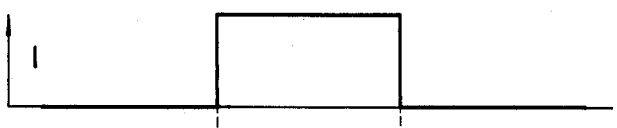
FIGS. 1A through 1D are waveform diagrams for explaining an eddy-current-originated problem in a conventional MR imaging system.
Figure 1B:
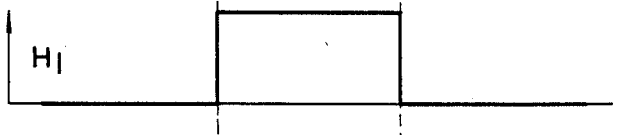
Figure 1C:
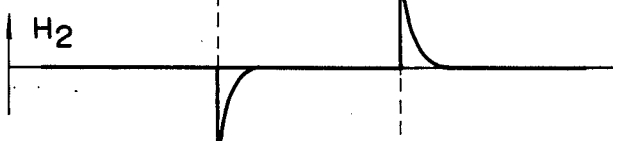
Figure 1D:
Figure 2B:
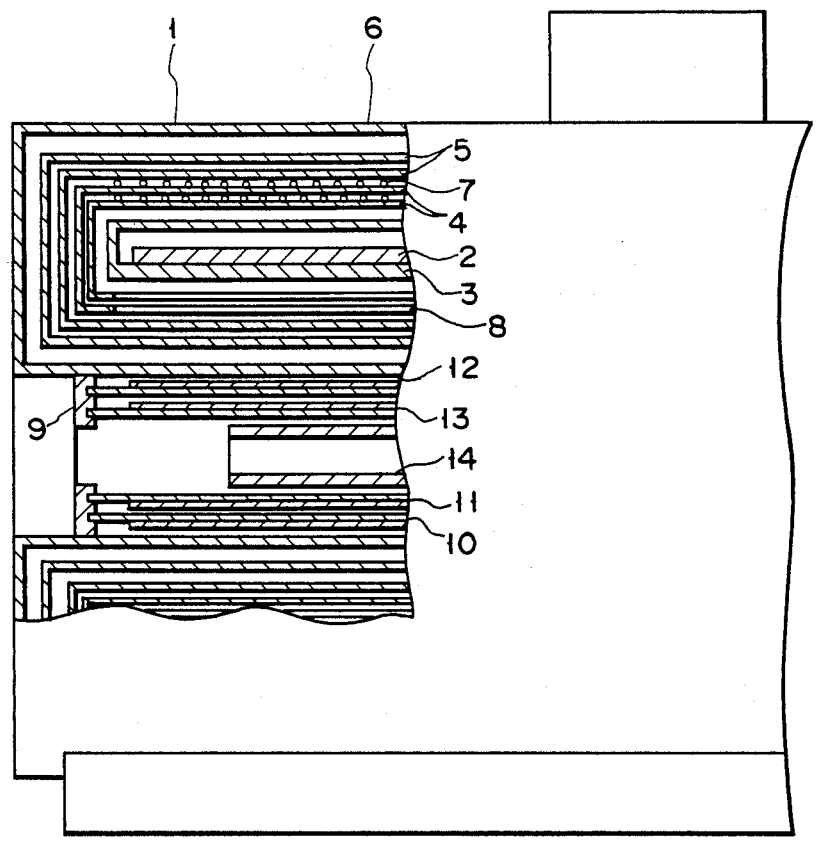

FIGS. 2A and 2B are respectively, partly-cutaway, front and side views illustrating a field generating system for use in an MR imaging system according to one embodiment of this invention. FIGS. 2A and 2B illustrate a superconducting magnet for generating a static magnetic field and a section that includes a gradient coil section located inside the magnet section and a probe coil section.

A superconducting magnet 1 constituted by a static magnetic field generating superconducting magnet accommodated in a cryostat comprises a superconducting wire 2, a bobbin 3, a heat shielding member 4, a liquid nitrogen container 5, an outermost wall 6 and a conduit 7. The superconducting wire 2, constituting a superconducting coil, is accommodated in bobbin 3 that is a hollow cylindrical container. More specifically, superconducting wire 2 is wound around the internal wall of bobbin 3 (i.e., on the wall on that side of the bobbin which is closer to the axis or has a smaller radius). Outside the bobbin 3 are sequentially disposed heat shielding member 4, liquid nitrogen container 5 and outermost wall 6 with space therebetween. Therefore, these heat shielding member 4, liquid nitrogen container 5 and outermost wall 6 have a hollow cylindrical shape as illustrated. Each of heat shielding member 4 and liquid nitrogen container 5 has a double structure constituted by two hollow cylindrical members. Liquid nitrogen container 5 has liquid nitrogen as a cooling medium filled in the space between the two hollow cylindrical members. The hollow cylindrical members forming the double structure are supported by a member (not shown) so as to maintain the mutual positional relationship. Bobbin 3 is formed by a material with a non-magnetism at a low temperature, such as stainless steel, and has liquid helium filled therein. Heat shielding member 4 is formed of metal, which has a high thermal conductivity, such as aluminum. This heat shielding member 4 is provided with conduit 7 that lets a helium gas produced by vaporization of the liquid helium in bobbin 3 go out of the bobbin, and is cooled by the helium gas. Liquid nitrogen container 5 which contains liquid nitrogen is formed of metal with poor thermal conductivity, such as stainless steel. The space between bobbin 3 and heat shielding member 4, the interior of heat shielding member 4, the space between heat shielding member 4 and liquid nitrogen container 5 and the space between liquid nitrogen container 5 and outermost wall 6 are made vacuous. Outermost wall 6 may be made of any material as long as it has a sufficient strength and airtightness to keep the vacuum state and is non-magnetic.

A ring-shaped support member 9 is fitted in and fixed at both end portions of the internal wall of outermost wall 6 of superconducting magnet 1 constituted in the above manner. A shim coil 12 and a gradient coil 13 are respectively wound around cylindrical bobbins 10 and 11, which are concentrically supported on the support member 9. Both of bobbins 10 and 11 are made of a non-metal, non-magnetic material such as fiber reinforced plastics (FRP). A probe coil 14 is removably fitted in the cylindrical space on the internal wall side of bobbin 11 on which gradient coil 13 is wound around. Shim coil 12 is provided to compensate for the non-uniformity of an static magnetic field generated by the superconducting magnet. Probe coil 14 is used to apply a high frequency field to a body under examination and to detect a magnetic resonance signal from the body.

Figure 3:
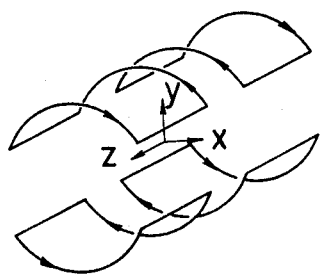
FIGS. 3 to 5 are schematic diagrams illustrating a model structure of inclined field coils for generating gradient fields in y, x and z directions, which are used in the embodiment shown in FIGS. 2A and 2B.
Figure 4:
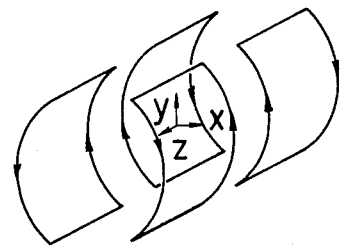
Figure 5:
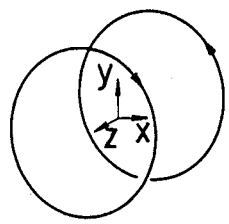

Gradient coil 13 is actually constituted by three types of coils as shown in FIGS. 3 to 5. FIGS. 3 to 5 respectively show coils for generating gradient fields in the y direction, the x direction and the z direction (the direction of the static magnetic field).

Part of the flux of the field generated by these gradient coils interlinks with a metal member such as heat shielding member 4 of static magnetic field generating superconducting magnet 1. Therefore, an eddy current flows in the metal member by a change in flux that interlinks with the metal member of superconducting magnet 1 at the rising and falling of the pulse gradient field, which is generated by superconducting magnet 13, and this eddy current causes a magnetic field to be generated from the metal member. As explained earlier with reference to FIGS. 1A to 1D, the eddy-current-originated field is generated at the rising and falling edge portions of the gradient pulse and is superimposed on the gradient pulse so that the waveform of the gradient pulse applied to the body would be deformed.

Of the metal members constituting superconducting magnet 1, bobbin 3 and liquid nitrogen container 5 formed by a material such as stainless steel, has a low electric conductivity and thus hinders the flow of the eddy current therethrough. In contrast, heat shielding member 4 is formed by aluminum, which is non-magnetic at a low temperature and has a high thermal conductivity, so that it has a high electric conductivity and thus facilitates the flow of the eddy current therethrough. This would undesirably generate an eddy-current-originated field if no measure is taken against it.

Figure 6:
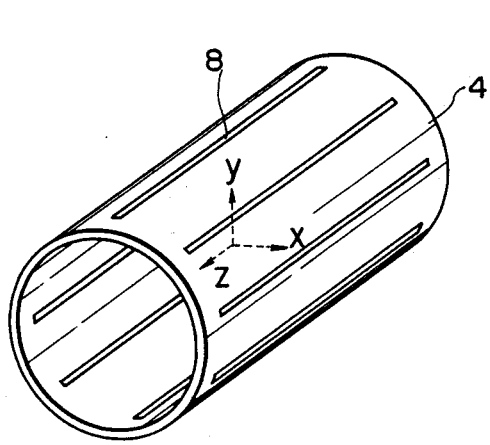
FIG. 6 is a perspective model view of part of a slit-formed heat shielding member used in the embodiment shown in FIGS. 2A and 2B.

According to the system of this invention, therefore, as shown in FIG. 6, a plurality of slits 8 serving as a non-conductive section are formed, for example, at the internal cylindrical portion constituting the internal wall of heat shielding member 4, along the static magnetic field direction (z direction). In this example, only 8 slits 8 are formed, as shown in FIG. 6, at the region of the internal cylindrical portion of heat shielding member 4, excluding both edge portions thereof (corresponding to the region to be subjected to image pick-up) with equal angular intervals between the slits and at locations in accordance with the gradient coils shown in FIGS. 3 and 4 (i.e., at the locations not to be imbalanced with respect to the gradient coils).

Slits 8 thus formed serve as a resistor against the eddy current flowing through heat shielding member 4, so that the eddy current can be impeded. The flux of the gradient field generated by gradient coil 13 interlinks with heat shielding member 4, and the flux-initiated eddy current tends to flow through heat shielding member 4 with a current distribution which has nearly the same shape as gradient coil 13 but in the opposite direction. If slits 8 are formed in the direction perpendicular to the flow of the eddy current, i.e., in the direction to shield the eddy current, therefore, the eddy current can significantly be reduced. According to the system of this embodiment, since slits 8 are formed in the static magnetic field direction (z direction), the flow of the eddy current along the circumferential direction of heat shielding member 4 (the direction perpendicular to the slits) can be impeded. This reduces the eddy current and also the field generated by the eddy current as a consequence. Therefore, deformation in the waveform of the gradient pulse (see FIG. 1D), which is originated from the superimposition of the eddy-current-initiated field superimposed on the original gradient pulse, can be reduced.

In addition, since slits 8 serve as a resistor (R) against the eddy current flowing through heat shielding member 4, the eddy current is reduced and its attenuation time constant ($\tau$) is reduced in accordance with the relationship $\tau = L/R$ (where L is an inductance relating to the eddy current). The effects of these two phenomena reduce the influence of the field generated by the eddy current on the gradient pulse.

It is desirable that slits 8 be formed in the aforementioned static magnetic field direction for the following reason. If the slits are made in the direction perpendicular to the static magnetic field, the strength of the heat shielding member against external force applied in the direction perpendicular to the static magnetic field direction would be weakened. This makes it difficult to stably and assuredly support heat shielding member 4 due to the nature of the supporting structure and deteriorates the thermal conductivity along the static magnetic field direction, which is important for heat shielding member 4 to function as designed.

In order to maintain a predetermined intensity distribution of the gradient field, it is also desirable that the effect of the reduction in the eddy current (or the current-initiated field) in heat shielding member 4 should not differ depending on locations on the member 4 but be constant at any location. In this respect, therefore, slits 8 should desirably be arranged at the equal angular intervals in the circumferential direction of heat shielding member 4 and in symmetrical fashion in the static magnetic field direction.

The present invention is not limited to the above embodiment, but can be modified in various manners within the scope and spirit of the invention.

Figure 7:
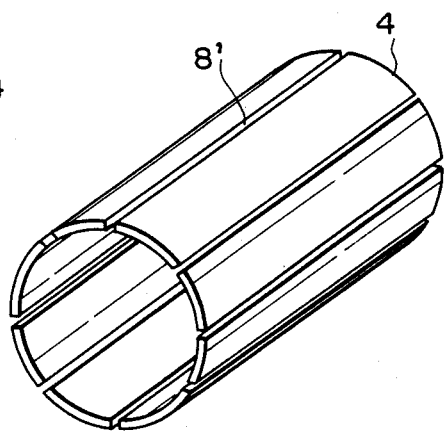
FIG. 7 is a perspective model view of a slit-formed heat shielding member used in a field generating system according to a second embodiment of this invention.

For instance, as illustrated in FIG. 7, slits 8' may be formed over the entire length of the internal cylindrical portion of heat shielding member 4.

Figure 8:
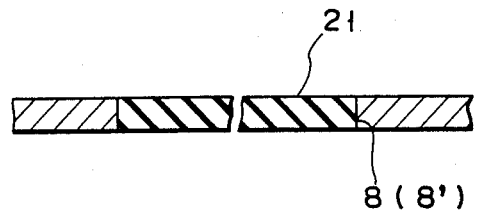
FIG. 8 is a model cross-sectional view of a slit section of a heat shielding member used in a field generating system according to a third embodiment of this invention.
Figure 9:
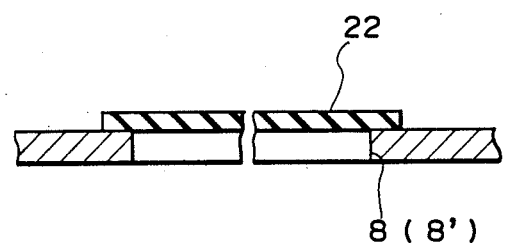
FIG. 9 is a model cross-sectional view of a slit section of a heat shielding member used in a field generating system according to a fourth embodiment of this invention.

In the above embodiments, slits 8 or 8' made open; however, as illustrated in FIGS. 8 and 9, a non-metallic electrically insulative material 21, such as fiber reinforced plastics FRP, may be filled in the opening portion of each slit 8 (or 8') or a cover made of a similar material may be provided over the opening portion to close it, thereby improving the mechanical strength of heat shielding member 4. Further, non-conductive sections such as the slits may be formed on other metal member than heat shielding member 4, for example, bobbin 3 or liquid nitrogen container 5. In the case where such non-conductive sections are formed on bobbin 3 or liquid nitrogen container 5, the opening of each slit needs to be closed by a non-metallic, electrically insulative material, as shown in FIGS. 8 and 9.

The shape of the non-conductive section is not limited to the slit shape; for example, each slit may be divided in a plurality of sections in the static magnetic field direction. Plural sets of non-conductive sections, e.g., the slits, each set containing a plurality of non-conductive sections, may be arranged evenly on the circumferential portion. Further, the non-conductive sections should not necessarily be arranged in parallel to the static magnetic field direction; they may be arranged slantingly to the static magnetic field direction. The non-conductive sections should desirably be arranged so as to evenly contribute to the reduction of a possible eddy current. For instance, to reduce the eddy current generated by the gradient field, the non-conductive sections would be most effective if their arrangment is determined in accordance with the arrangement of the gradient coils.

What is claimed is:

1. A magnetic field generating system for use in a magnetic resonance imaging system, which causes a magnetic resonance at least at a region of interest of a body under examination and obtains magnetic resonance data about said magnetic resonance to provide a magnetic resonance image of said region of interest, said field generating system for applying a gradient field and a high frequency field in a pulse form to said body, in addition to said static magnetic field, to excite said magnetic resonance and to collect magnetic resonance data about said magnetic resonance, and said magnetic field generating system comprising:

superconducting magnet means, including a superconducting coil, a heat shielding member, a bobbin and a cooling medium container which are cylindrically formed, for generating said static magnetic field, said body being inserted at a center portion of said superconducting magnet means, at least part of said superconducting magnet means being formed of a metal member and at least part, located inside said superconducting coil, of said metal member being provided with non-conductive sections for impeding an eddy current;

gradient coil means, arranged inside said superconducting magnet means, for generating a pulse of said gradient field to be applied to said body; and high frequency coil means for generating an excitation pulse of said high frequency field to be applied to said body, and detecting a magnetic resonance signal produced in said body;

wherein said at least part of said metal member provided with said non-conductive sections is interposed between said superconducting coil and said gradient coil means, and said non-conductive sections are slits formed on said metal member.

2. The system according to claim 1, wherein said slits are formed on said metal member in a static magnetic field direction.

3. The system according to claim 2, wherein said metal member is cylindrical and said slits are substantially evenly arranged in a circumferential direction with an axis of the cylindrical metal member being a center.

4. The system according to claim 2, wherein said slits are closed by non-conductive materials.

5. The system according to claim 1, wherein said metal member is said bobbin of said superconducting magnet means.

6. A magnetic field generating system for use in a magnetic resonance imaging system, which causes a magnetic resonance at least at a region of interest of a body under examination and obtains magnetic resonance data about said magnetic resonance to provide a magnetic resonance image of said region of interest, said field generating system for applying a gradient field and a high frequency field in a pulse form to said body, in addition to said static magnetic field, to excite said magnetic resonance and to collect magnetic resonance data about said magnetic resonance, said magnetic field generating system comprising:

superconducting magnet means, including a superconducting coil, a heat shielding member, a bobbin and a cooling medium container which are cylindrically formed, for generating said static magnetic field, said body being inserted at a center portion of said superconducting magnet means, at least said bobbin of said superconducting magnet means being formed of a metal member and at least part of said metal member being provided with non-conductive sections for impeding an eddy current;

gradient coil means, arranged inside said superconducting magnet means, for generating a pulse of said gradient field to be applied to said body; and high frequency coil means for generating an excitation pulse of said high frequency field to be applied to said body, and detecting a magnetic resonance signal produced in said body.

* * * * *